(12) United States Patent
Yazici et al.

(10) Patent No.: US 6,192,317 B1
(45) Date of Patent: Feb. 20, 2001

(54) STATISTICAL PATTERN ANALYSIS METHODS OF PARTIAL DISCHARGE MEASUREMENTS IN HIGH VOLTAGE INSULATION

(75) Inventors: Birsen Yazici, Clifton Park; John Raymond Krahn, Niskayuna, both of NY (US)

(73) Assignee: General Electric Company, Schenectady, NY (US)

(*) Notice: Under 35 U.S.C. 154(b), the term of this patent shall be extended for 0 days.

(21) Appl. No.: 09/517,088

(22) Filed: Mar. 6, 2000

Related U.S. Application Data

(62) Division of application No. 08/837,932, filed on Apr. 11, 1997, now Pat. No. 6,088,658.

(51) Int. Cl.$^7$ ............................................. G01R 31/08
(52) U.S. Cl. ............................................. 702/58; 324/536
(58) Field of Search ........................ 702/57–59, 81–84, 702/179–185; 706/21, 47, 52; 324/512, 522, 536, 551, 772

*Primary Examiner*—Marc S. Hoff
*Assistant Examiner*—Craig Steven Miller
(74) *Attorney, Agent, or Firm*—John F. Thompson; Jill M. Breedlove

(57) ABSTRACT

Statistical methods of partial discharge analysis utilizing histogram similarity measures are provided by quality assessment and condition monitoring methods of evaluating high voltage electrical insulation. The quality assessment method is utilized to evaluate the quality of insulation within the electrical equipment. The condition monitoring method is utilized during normal operation of the equipment to identify degradation in the insulation and to predict catastrophic insulation failures.

10 Claims, 4 Drawing Sheets

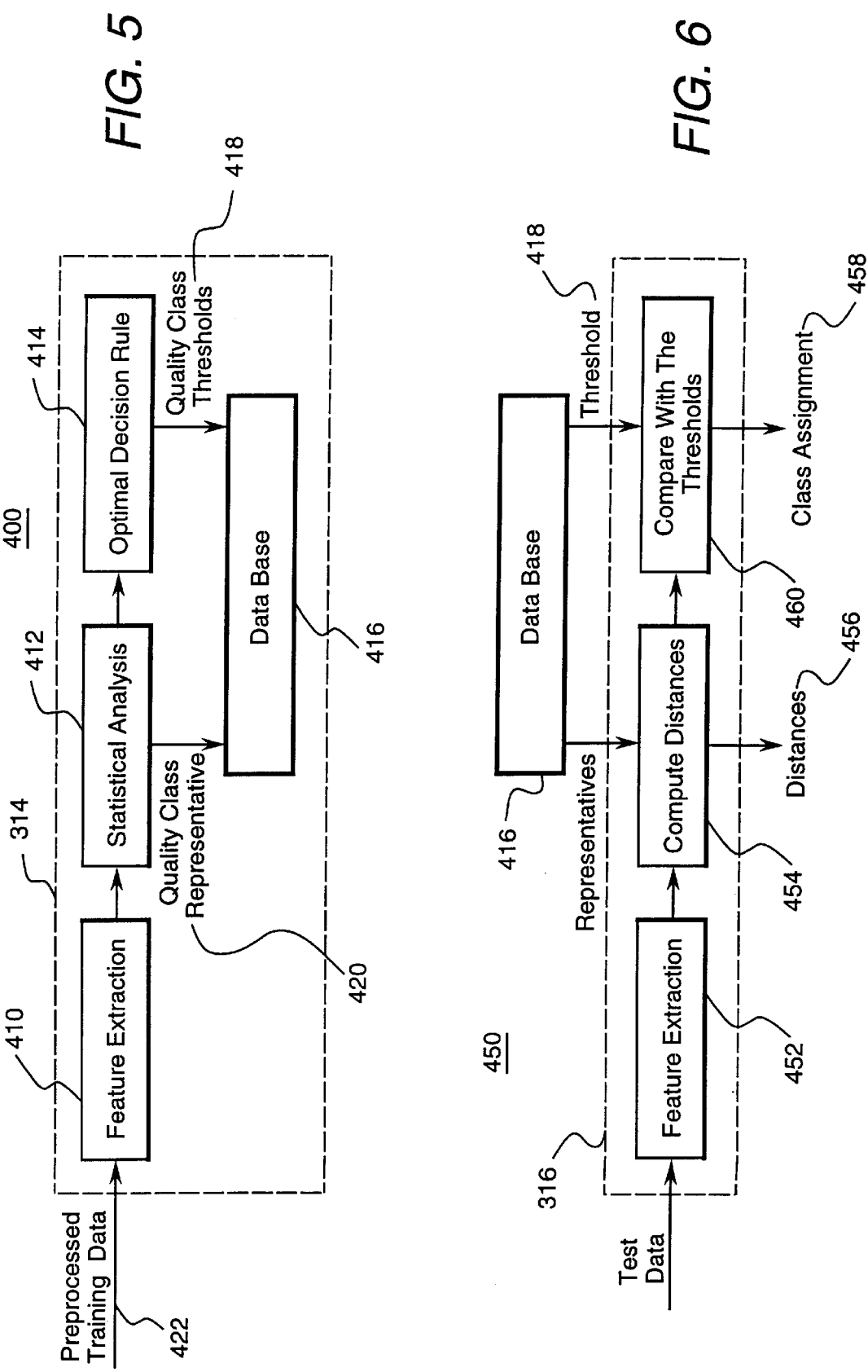

STATISTICAL PATTERN ANALYSIS METHODS OF PARTIAL DISCHARGE MEASUREMENTS IN HIGH VOLTAGE INSULATION

This application is a division of application Ser. No. 08/837,932, filed Apr. 11, 1997 now U.S. Pat. No. 6,088,658, which is hereby incorporated by reference in its entirety.

BACKGROUND OF THE INVENTION

This invention relates to quality assessment and condition monitoring of electrical insulation and more particularly to statistical pattern analysis and diagnostics of partial discharge measurements of high voltage insulation.

Partial discharge (PD) analysis has been established as a useful diagnostic tool to asses high voltage insulation systems for integrity and design deficiencies. Interpretation of the PD patterns can reveal the source and the reason for the PD pattern occurrence, and therefore, has been used as a condition monitoring and quality control tool by the manufacturing industry. Analysis of PD patterns for high voltage electrical equipment has often times been an heuristic process based on empirical reasoning and anecdotal information. This is particularly true for insulation systems encountered in high voltage rotating machinery. Typically high voltage insulation is a heterogeneous composite comprising tape, mica flakes, and resin. No insulation system is perfect and there is a statistical distribution of voids and other defects throughout the insulation system. This void distribution results in a baseline level of PD activity for all insulation systems. The associated discharge phenomena are often complicated, multi-faceted events. Discerning between "normal" and defective insulation systems often require more than simple trending of discharge levels.

For many years, the use of PD results for insulation was impracticable because of the difficult data manipulation problems presented. It is thus desirable to identify defective high voltage electrical equipment by the analysis of PD events in an effective and economic manner.

Typically, users of expensive high voltage electrical equipment incur extraordinary expenses when the equipment unexpectedly fails. The ability to predict failures of this equipment would enable the equipment user to utilize condition-based maintenance techniques to avert such unexpected failures and associated high costs. Additionally, scheduled maintenance plans cause users to incur unnecessary costs when equipment is found to be functioning satisfactorily after the scheduled maintenance. Therefore, there exists a need to monitor high voltage insulation when the high voltage equipment is in operation to predict when a catastrophic defect will occur so as to avoid excessive damage and unexpected and costly repair of the high voltage electrical equipment caused by the defect.

There exists a need to identify when a defect exits in insulation before it is placed in the high voltage equipment by assessing the quality of the insulation. It is also desirable to identify the type of defect in the insulation after it is detected.

SUMMARY OF THE INVENTION

The present invention addresses the foregoing needs by providing a system for evaluation of the insulation system of high voltage equipment, including quality assessment and condition monitoring.

The quality assessment method includes extracting representative quality class thresholds from partial discharge (PD) measurements of known insulation quality during a training stage. These quality class representatives and quality class thresholds from the baseline are used for comparison to analysis features of partial discharge test data to assess the quality of undetermined insulation. Histogram similarity measures are utilized to determine the representatives of the quality class thresholds of each insulation quality type.

The condition monitoring method includes collecting periodic PD measurements of insulation during the normal operation of high voltage equipment. Trend analysis is employed to identify any deviation from an expected baseline of high voltage electrical equipment.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 5 is an illustration of the major steps of the training step of the quality assessment method.

FIG. 6 is an illustration of the major steps of the testing step of the quality assessment method.

DETAILED DESCRIPTION OF THE INVENTION

In this Specification, two data analysis methods are presented for intelligent characterization and interpretation of partial discharge PD patterns including: a statistical classification method utilizing histogram based analysis to analyze the quality of an insulation system; and a statistical trending method utilizing histogram analysis for the condition monitoring of insulation systems.

High voltage equipment includes for example, high voltage generators, motors, transformers, and transmission lines.

Figure 1:
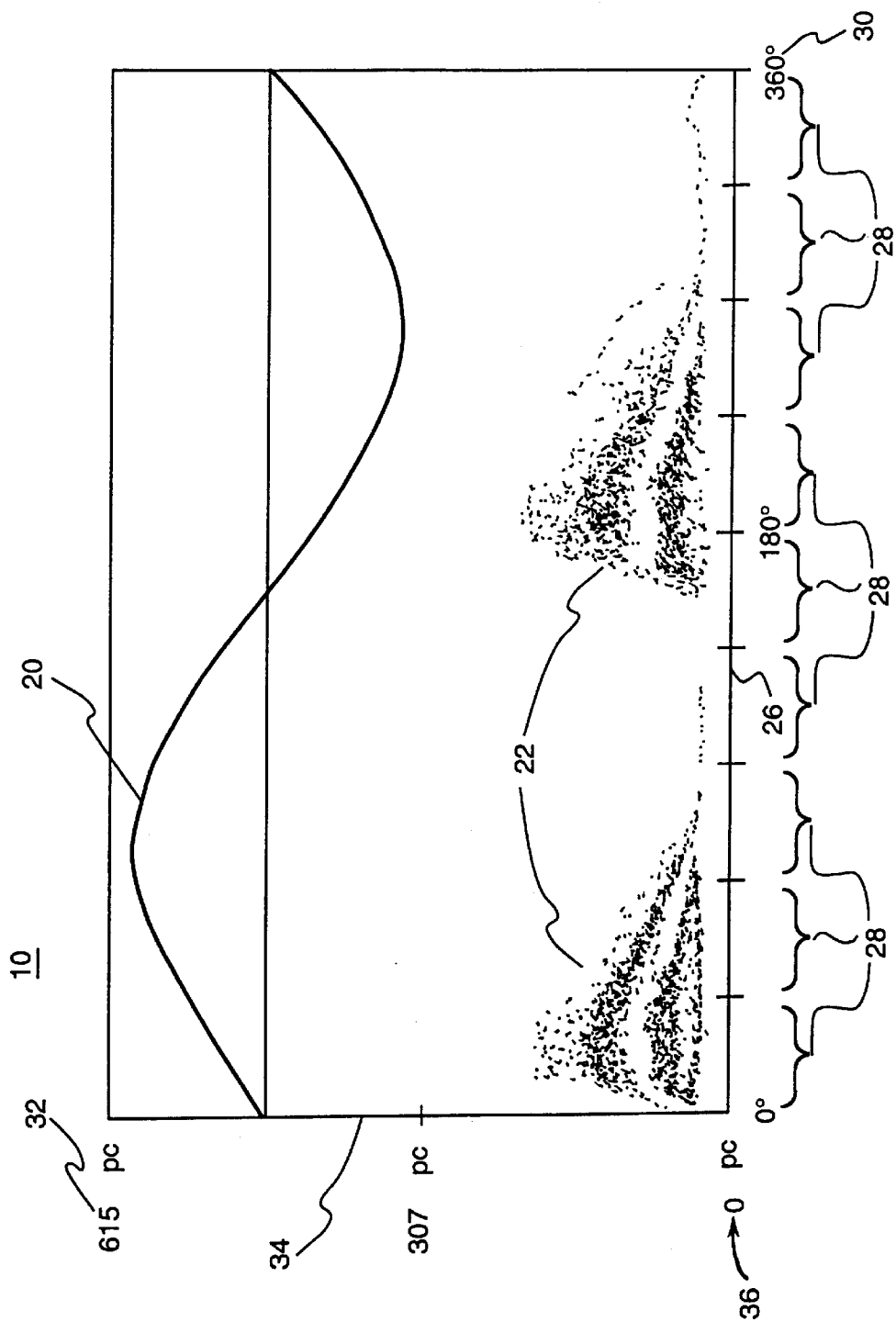
FIG. 1 is an illustration of a two dimensional phase resolved PD plot utilized in this invention.

As illustrated in FIG. 1, the PD measurement is presented in a two dimensional PD plot 10 in which the horizontal axis 26 is delineated by a predetermined number of phase windows 28 and the vertical axis 34 is delineated by the magnitude of each PD event set 22 measured in pico-farads 32. Two dimensional PD plot 10 is phase resolved, that is, PD event set 22 is taken at predetermined intervals or phase windows 28 in correspondence with a single voltage cycle 20.

Figure 4:
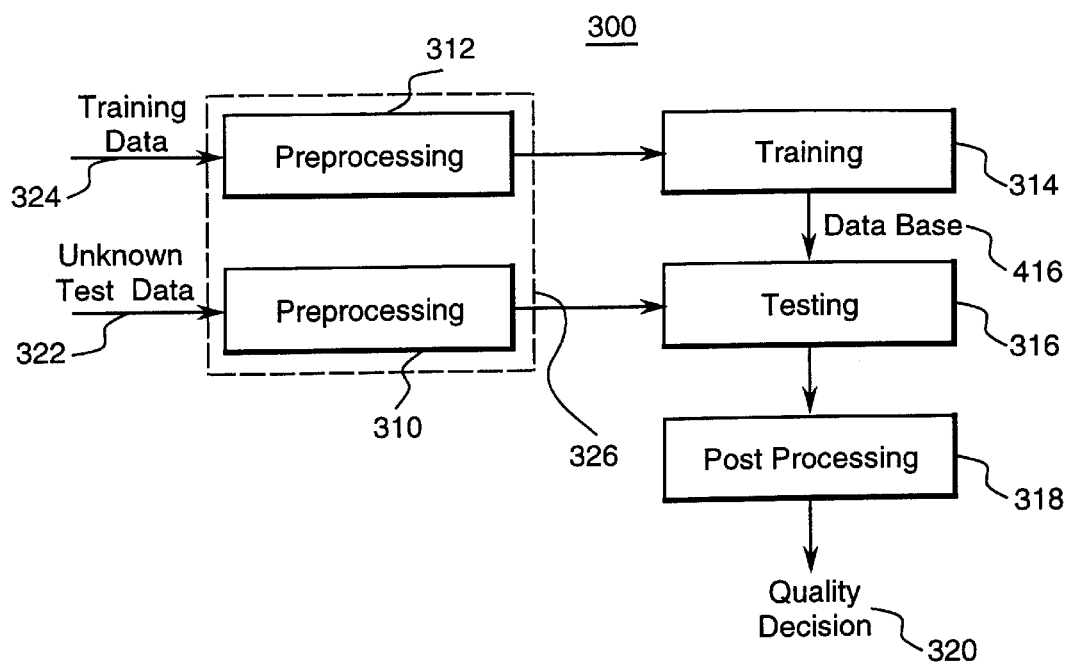
FIG. 4 is a illustration the major steps of the quality assessment method of this invention.

During the quality assessment method, a set of PD reference measurement data 324 (FIG. 4) are acquired from high voltage equipment having various known defects and from equipment having no defects. A representative PD measurement is extracted from each of these reference measurements and a respective histogram threshold value that is utilized to identify defects and defect types is determined by computing the histogram similarity distance between the undetermined insulation and the representative PD measurements within the reference PD data set. The respective histogram threshold value 418 and the representative PD measurement are then stored in a data base 416 to be used as baselines for insulation of undetermined quality. When undetermined high voltage insulation is tested, PD measurements 322 are acquired and compared to data from reference PD data 324, and a statistical distance difference is calculated. If the statistical distance is less than histogram minimum threshold value 418 the high voltage insulation is identified as being within normal operating parameters, hereinafter referred to as "healthy." Otherwise, it is identified as defective high voltage insulation.

During condition monitoring, analysis test data 322 are acquired periodically and consecutive measurements are compared using a histogram similarity measure. If there is a significant deviation in the histogram similarity measure as compared to the measurements acquired in the past, the algorithm generates a indication in correspondence with the degradation in the insulation system. The amount of the deviation in the newly acquired histogram similarity measure may be correlated with the severity of the degradation in the insulation system.

1(a) Histogram Type Measures

Figure 2:
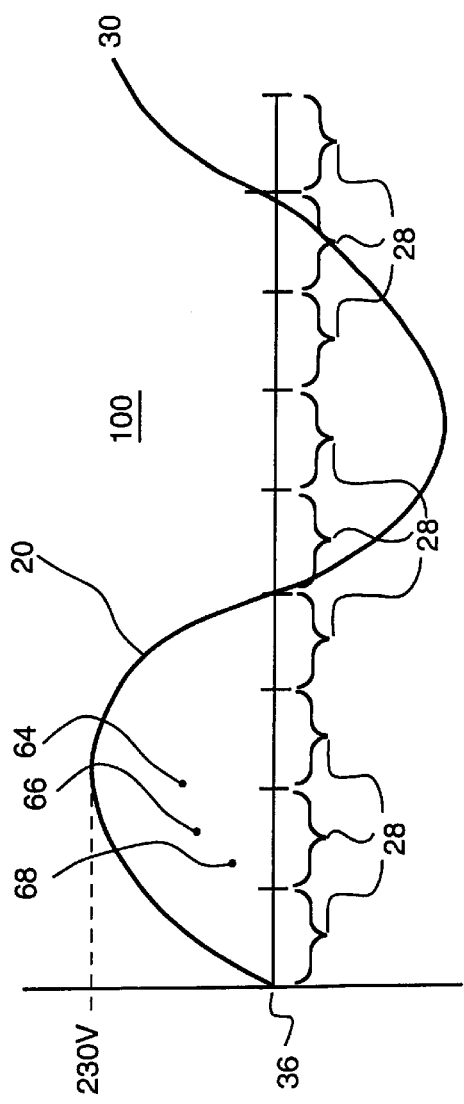
FIG. 2 is an illustration of the voltage cycle over which a PD measurement is taken.

In both the quality assessment and condition monitoring methods histogram similarity measures are utilized. PD measurements 22 are grouped by phase window 28 with respect to one cycle of source voltage 20 in phase resolved PD measurement data. For example, one cycle of source voltage 20 is a single cycle of a sixty hertz signal as illustrated in FIG. 2. The single cycle of source voltage 20 is divided into the preselected number of phase windows 28. For example,. when two-hundred-fifty-six phase windows are selected, each phase window 28 is represented by approximately 1.4 degrees of source voltage phase. Each phase window 28 collects respective PD measurement data 64, 66, and 68 for about thirty seconds of voltage cycles corresponding with its relative position within source voltage 20. This data forms the basis of a histogram footprint.

Figure 3:
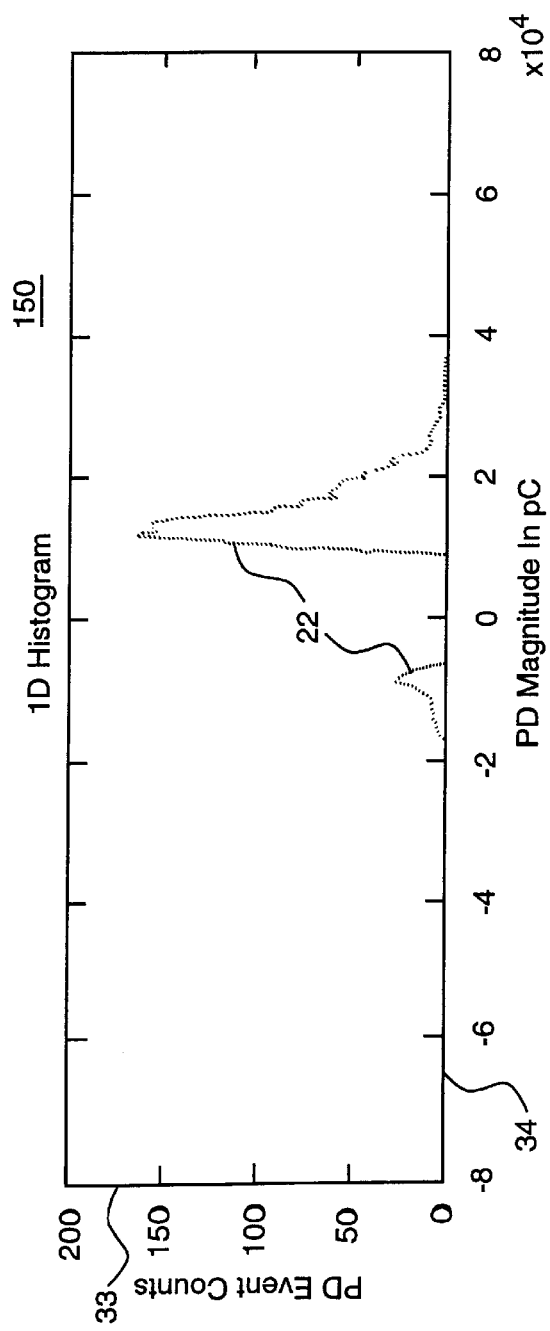
FIG. 3 is an illustration of a one dimensional PD plot utilized in this invention.

A one dimensional histogram has as its horizontal axis the PD magnitude in pico-farads 34 and the vertical axis as the PD event count 33 as illustrated in FIG. 3. PD event set 22 is plotted in the one dimensional histogram. Phase resolved PD plot 10 is illustrated as a collection of these one dimensional histograms.

Alternatively, only the total number of occurrences need be evaluated for each phase window 28 or PD magnitude 34, i.e., the sum of individual PD events 22 for each phase window 28 or for each PD magnitude 34. The histogram obtained by the sum of the individual PD events 22 for each phase window 28 is the phase marginal histogram or X-marginal histogram, and the histogram obtained by the sum of the individual PD events for each PD magnitude is the magnitude marginal histogram or Y marginal histogram.

1(b) Histogram Similarity Measures

The following histogram similarity measures are utilized by way of example and not limitation, to process the previously described histograms: (1) Sample correlation, (2) Kolmogorov-Simimov distance, and (3) Chi-square test.

To simplify the discussion, these measures shall be described for one dimensional histogram 150. The two dimensional description is a simple extension of several one dimensional histograms.

The normalized joint probability mass function of phase windows 28 and PD magnitudes is computed by dividing the histogram into the total unit area. The Probability Mass Function or Normalized Histogram is defined by equation 1 below.

$$P(i) = \frac{h(i)}{A}, i = 1, \ldots, N, \quad (1)$$

where h(i) is the number of events whose intensity is "i", "A" is the total number of events in the observation set, and "N" is the number of phase windows 28 over a single voltage cycle.

The Cross Correlation value "cr" as defined in equation 2 below:

$$cr = \frac{\sum_{i=1}^{N}(P_1(i)-\mu_1)(P_2(i)-\mu_2)}{\sqrt{\sum_{i=1}^{N}(P_1(i)-\mu_1)^2 \sum_{i=1}^{N}(P_2(i)-\mu_2)^2}}, \quad (2)$$

where $\mu_i$ is the mean value of probability mass function P(i).

The Kolmogorov-Simimov Distance is calculated using the Cumulative Distribution function, the Kolmogorov Simirnov distance 1 function, and the Kolmogorov Simirnov distance 2 function.

The Cumulative Distribution Function is defined by equation 3 below:

$$H(k) = \sum_{i=1}^{k} P(i), \quad (3)$$

where $H_t(k)$ is the probability that the intensity "i" is less than or equal to k.

The Kolmogorov Simimov distance 1 between two cumulative distributions is defined by equation 4 below:

$$KS1 = \max_{k}|H_1(k) - H_2(k)|, \quad (4)$$

The Kolmogorov Simirnov distance 2 is defined by equation 5 below:

$$KS2 = \sum_{k=1}^{N}|H_1(k) - H_2(k)|. \quad (5)$$

Alternatively, the Chi-Square Test is utilized to calculate the normalized histogram. The Chi-square statistic is described as follows:

$$\chi^2 = \sum_{i=1}^{N}\frac{(h(i)-AP(i))}{AP(i)} \sum_{i=1}^{N} p_i = 1. N_i i = 1, \ldots, N \quad (6)$$

where P(i) is a known probability mass, and h(i)' is the number of events at intensity "i", where $$\sum_{i=1}^{N} h(i) = A.$$

It is desirable to know whether h(i)'s are drawn from the population represented by the P(i)s. If the h(i)'s are drawn from the population represented by P(i)s, then as A→∞, each term in the summation of the equation (6) is the square of a Gaussian random variable with zero mean and unit variance. Therefore, $x^2$ is a random variable with Chi-square distribution. A large value of $x^2$, for example, $x^2 \gg N$, indicates that it is rather unlikely that the h(i)'s are drawn from the population represented by P(i) because $Pr(x^2 > C|N)$ is very small.

$Pr(x^2 > C|N)$ is the probability that the Chi-square statistic is at least "C", given that there are "N" phase windows 28, alternatively called bins, in the histogram and that h(i)'s are drawn from the population represented by P(i)s. The value of $Pr(x^2 > C|N)$ is computed by the incomplete gamma function below:

$$Pr(\chi^2 > C \mid N) = \frac{\int_{C/2}^{\infty} e^{-x} x^{N/2-1}}{\int_{C/2}^{\infty} e^{-x} x^{N/2-1}}. \tag{7}$$

The Chi-Square test for two histograms is described next. Since the precise probability mass functions of PD event set 22 is not ascertainable, what is implemented is a modified Chi-square test which checks whether two measurements $h_1(i), i=1, \ldots, N$, and $h_2(i), i=1, \ldots, N$ are drawn from the same population by a predetermined probability distribution function. In this case the Chi-square statistic is given by:

$$\chi^2 = \sum_{i=1}^{N} \frac{\left(\sqrt{A_2/A_1}\, h_1(i) - \sqrt{A_1/A_2}\, h_2(i)\right)}{h_1(i) + h_2(i)} \tag{8}$$

where $\sum_{i=1}^{N} h_1(i) = A_1$ and $\sum_{i=1}^{N} h_2(i) = A_2$.

In this implementation, $h_1(i)$ is the first histogram, and $h_2(i)$ is the second histogram of PD measurements. Note that if $h_1(i)=h_2(i)=0$ for some phase window "i", then the corresponding term is dropped in the summation in equation (8).

2. Quality Assessment

The quality assessment method is a "supervised" approach, that is, the type and the number of reference quality classes, against which the insulation of high voltage equipment is tested, are predetermined. It is utilized for detection, as well as the identification of reference quality classes. Detection involves automatic decision making to determine whether high voltage equipment has "healthy" or "defective" insulation. Identification, on the other hand, involves defect detection, as well as, classification of the defect to one of the known quality classes.

As more information is provided to the system, better inference of the quality of the insulation can be achieved. For instance, for defect detection, only a set of PD measurements representing a "healthy" insulation system is needed. For quality class identification, however, PD measurements from each quality class are needed. The following list, for example, is a group of quality classes that are detected including: suspended metal particles in insulation; armor degradation; conductor and insulator delamination; insulator/insulator delamination; and insulator/armor delamination. A list of these failures are illustrated in Table 1. The outcome of such a quality assessment utilizing the present invention generates one of these three associated quality class group indications, "healthy" insulation, "defective" insulation of known quality class, and "defective" insulation of undetermined quality class. As more quality classes are programmed into the reference set of detect types the identification capability of the system improves.

The quality assessment method comprises four stages including: pre-processing 326, reference 314, testing 316, and post-processing 318 as illustrated in the flow diagram in FIG. 3. In pre-processing stage 312, PD reference data 324 may be subjected to signal conditioning methods, such as gain normalization, phase synchronization and excitation noise suppression. In reference stage 314, the characteristics of the defected and good insulation are learned and memorized from reference data 324. The learning process involves extraction of the characteristics or quality class features from reference data 324 and statistical analysis of the quality class features. Statistical analysis of the quality class features leads to a set of quality class representatives 420 for the quality class features and an optimal decision making rule 414 as illustrated in FIG. 5. Using the reference data and the decision rule, quality class thresholds 418 is calculated for each quality class feature. Finally, a respective quality class representative 420 of each quality class along with a respective quality class thresholds 418 is stored in data base 416 for use during testing stage 316. In testing stage 316, respective quality class features 452 are extracted from a each test bar and a statistical distance between quality class representative 420 of each respective quality class and the quality class features is computed. The resulting respective distance 456 is compared with respective quality class thresholds 418 in data base 416 to assign the test measurement to one of the quality classes stored in data base 416. In post-processing stage 318 results from multiple PD measurements are combined to increase the confidence level and a probability is associated with each decision to quantify the accuracy of the process. Each of the four quality assessment stages is discussed in more detail below.

2.(a) Pre-Processing

In prepossessing stage 326, reference data 324 and analysis test data 322 may be conditioned in any one of the following ways or in combination with multiple sets of the following ways: a) to convert from bipolar data to uni-polar data; b) to phase synchronize with supply voltage 20; c) to be normalized with respect to a gain factor; and d) digital filtering may be utilized to suppress the excitation noise in reference data 324 and analysis test data 322.

2.(b) Training

The flow diagram of the training process 314 is illustrated in FIG. 5. Low count high magnitude PD events contain more discriminative information than the low magnitude high count PD events. In one embodiment of the feature extraction process, the logarithm of the PD event counts is calculated. In addition the effect of high count low magnitude events may be suppressed by setting a predetermined lower-level PD magnitude threshold discarding data below this value. Typically, the lower-level PD magnitude threshold is the bottom ten percent of the PD magnitude range.

Respective quality class representatives 420 from each quality class is extracted by averaging reference data 324. Expressed mathematically let $R_i$ denote the quality class representative 420 of the quality class i and $P_i^j$ be the "jth" member of the quality class "i." Next, an intra quality class distance between its quality class representative 420, $R_i$, and each of its member, $R_i^j$, in reference data set 324 is calculated by using the histogram similarity measures introduced above.

$$D_i^j = d(P_i^j, R_i) \tag{9}$$

where d is the histogram similarity measure. Note that in the case of 1D histogram similarity measures, the distance function is a vector in which each entry is the distance between the member and reference 1D histograms of respective phase window 28. To clarify this difference, vector notation for the 1D histograms is introduced:

$$D_i^j(\omega)=d(P_i^j(\omega),R_i(\omega)), \omega=1,\ldots,L. \quad (10)$$

$\omega$ corresponds to the phase window 28, and the value L was selected based on the number of phase windows 28 over a single cycle of source voltage 20 as discussed above.

In order to obtain an optimal radius for each quality class, the sample mean and standard deviation of the distances within each quality class are calculated. For 2D histograms the intra quality class mean radius and standard deviation are given as follows:

$$\overline{D}_i = \frac{1}{N_i}\sum_{j=1}^{N_i} D_i^j \quad (11)$$

$$\sigma_i = \sqrt{\frac{1}{N_i}\sum_{j=1}^{N_i}(D_i^j - \overline{D}_i)^2} \quad (12)$$

where $N_i$ is the number of samples available for the quality class "i." For the 1D phase resolved histograms the intra-class mean radius and standard deviation are given by $$\overline{D}_i(\omega) = \frac{1}{N_i}\sum_{j=1}^{N_i} D_i^j(\omega) \quad (13)$$

$$\sigma_i(\omega) = \sqrt{\frac{1}{N_i}\sum_{j=1}^{N_i}(D_i^j(\omega) - \overline{D}_i(\omega))^2}, \omega=1,\ldots,L. \quad (14)$$

Next, an $\alpha$ unit standard deviation tolerance is allowed for each quality class radius. Note that in the case of Gaussian distribution of the intra-class distances, $\alpha$ is typically chosen to be two to provide a 99% confidence interval. The quality class radius, for the respective 2D and 1D histograms are given as follows:

$$\tau_i = \overline{D}_i + \alpha\sigma_i \quad (15)$$

$$\tau_j = \sum_{\omega=1}^{256} \overline{D}_i(\omega) + \alpha\sigma_i(\omega), \omega=1,\ldots,L. \quad (16)$$

Finally, for each quality class $\{R_i, \tau_i\}$ are stored in the data base as quality class representative 420 and the quality class threshold 418 of each quality class.

2.(c) Testing

The major steps of testing stage 316 is illustrated in FIG. 6. Analysis test data 322 is utilized in the following steps. First, analysis test data 322 are subjected to the steps discussed in pre-processing stage 312 prior to extracting the relevant features. Next, the distance between the analysis feature, T, and the references of each quality class $R_i$ are computed using one of the histogram similarity measures described above. For the 2D histogram, the distance is given by a scalar quantity (equation 17) while for the 1D histogram similarity measures, it is given by a vector quantity (equation 18):

$$\Delta_i = d(T,R_i) \ i=1,\ldots,C \quad (17)$$

$$\Omega_i(\omega) = d(T(\omega),R_i(\omega)), \omega=1,\ldots,L, i=1,\ldots,C \quad (18)$$

where "C" is the number of quality classes. In order to compare the vector quantity identified in equation (18), with quality class threshold 418, a cumulative distance is computed by summing the quantity in equation (18) over the phase windows 28:

$$\Delta_i = \sum_{\omega=1}^{L} \Omega_i(\omega) \quad (19)$$

Next, the respective distance between the analysis features and quality class representative 420 of each quality class, $\Delta_i$, are calculated. If the distance is greater than all quality class thresholds 418, the test measurement is tagged as "defective." However, the quality class is not one of the types for which the algorithm is trained to recognize. If the distance is less than one or more quality class thresholds 418, the test measurement is assigned to the quality class to which the distance between the associated reference and analysis feature is minimum. If the final assignment is the quality class of healthy insulation, the measurement is tagged as "healthy."

To improve the accuracy of this quality class assignment, testing stage 316 is repeated for multiple sets of analysis test data 322. Decisions obtained for each set of analysis test data 322 and distances of each feature to each quality class representative 420 are then subjected to post-processing 318 to finalize the decision of each undetermined insulation system.

2.(d) Post-Processing

In post-processing stage 318, there are two major tasks: first, the decisions in testing stage 316 are combined; second, a probability is associated to each decision to reflect the accuracy of the quality classification.

The distance of the analysis feature to a quality class as illustrated in equation (17) is quantified in terms of unit standard deviation of the quality class. Relative comparison of these distances determines the accuracy of the final decision. The distances are mapped to a probability distribution function in order to compare these decisions. If the distance between the analysis feature and the quality class is zero, or significantly larger, such as $\alpha^2$, The classification decision is about 100% accurate. In the case of zero distance, analysis test data set 322 belongs to the quality class with probability 1. In the case of $\alpha^2$ or larger distances, the probability that analysis test data set 322 belongs to the quality class is zero. The difficulty arises when assigning a probability to the distances that are between zero and $\alpha^2$. To resolve this issue, equation (20) is used between the distance and probability spaces.

$$f(\Delta) = \begin{cases} \left(1 - \frac{\Delta}{\gamma}\right)^{-\beta} & 0 \le \Delta < \gamma \\ 0 & \Delta \ge \gamma \end{cases} \quad (20)$$

Note that when the distance is zero, i.e., $\Delta=0$, the probability, $f(\Delta)$, is 1, and when the distance is greater or equal to $\gamma$, the probability is zero.

Two parameters in equation (20) are user-controlled, namely γ and β. The parameter γ controls the threshold beyond which the probability that a measurement coming from a particular quality class has distance γ or larger. This distance can be set to an order magnitude larger than the threshold α, such as $\alpha^2$ unit standard deviation. The parameter β controls the confidence in quality class identification power of the testing scheme. This parameter is preselected so that 80% or more values should be correctly classified. If a value is chosen at the 80% quality class identification level, β is given as follows:

$$\beta = = ln0.8 / ln(1 - \alpha/\gamma) \quad (21)$$

Or more generally, choose β so that f(α) is equal to the confidence level defined as a probability percentage. For example, when f(Δ), is selected to be 80% γ, may be selected to be four and β is calculated to be −0.322. These parameters enable a quality class likelihood to be assigned each analysis test data set 322. Other values for equation (20) may also be selected.

While probability mapping functions defined in equations (20) and (21) are utilized in this invention, any technique can be utilized to produce the above results, for example, a computer look-up table, or a set of logical rules defined in a computer program.

Next, the quality class assignments and the associated probability values are combined to get a final quality class assignment and a probability value for analysis test data set 322. The steps of this process are summarized as follows:

A probability value is assigned to each analysis test data set 322 describing the likelihood of the measurement belonging to each quality class in the database. Let $p_i^j$, j=1,..., M and i=1,..., N be the probability that the measurement j belongs to quality class i. where "M" is the total number of measurements.

Next, $\bar{p}_i$ is defined as the probability that the analysis test data set 322 representing a test bar belongs to quality class i with probability $\bar{p}_i$.

$$\bar{p}_i = \frac{1}{M} \sum_{j=1}^{M} p_i^j, i = 1, \ldots, C \quad (22)$$

The insulation represented by analysis data set 322 is next assigned to the quality class with the highest overall probability, i.e., $$\hat{i} = Argmax/i \; \bar{p}_i \quad (23)$$

where Argmax is the quality class at which $\bar{p}_i$, i=1,... N is maximum.

An example of the above described quality assessment method, is presented. Several quality class classes of generator stator bars, hereinafter described as bars or generator bars, were programmed into the statistical model as several respective reference data sets 324. Next, undetermined generator bars were evaluated based on respective reference data set 324. The results are described and illustrated below.

Several types of stator bar defects or quality classes were investigated including suspended metallic particles in the insulation, slot armor degradation, corona suppresser degradation (i.e., the external voltage grading), insulation-conductor delaminations, insulator-insulator (bound) delaminations, and "white" insulation. Each of these quality class has implications for either quality assessment or condition monitoring either during production or during service Each bar was subjected to a specific sequential set of events to ensure consistent reliable PD data.

Figure 7:
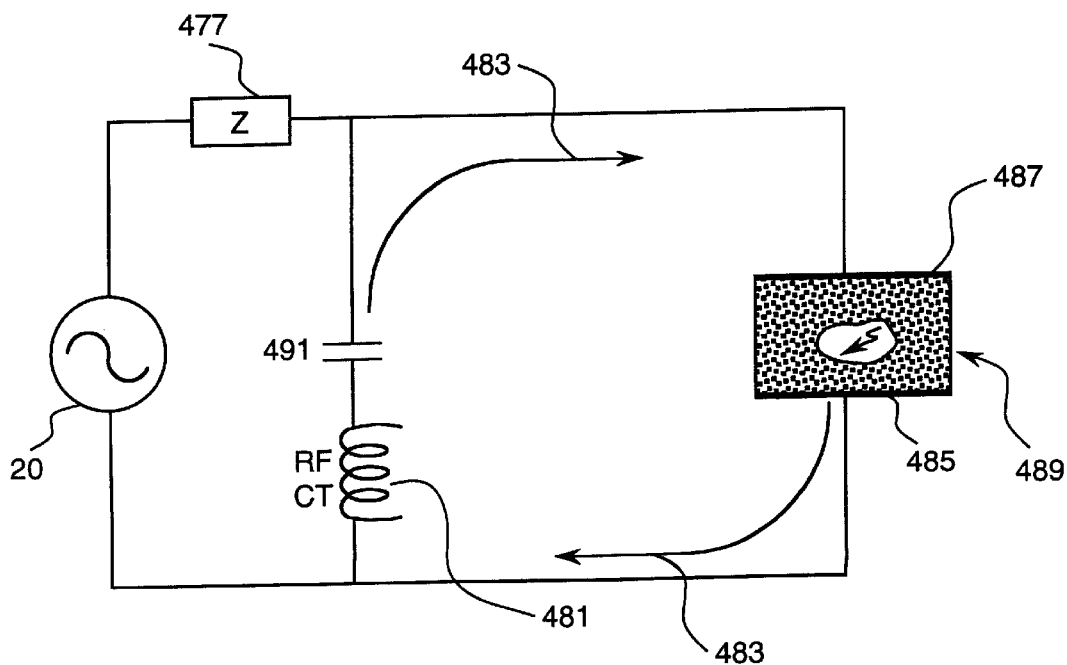
FIG. 7 is an illustration of the test configuration for making PD measurements during the quality assessment method.

The typical test configuration is illustrated in FIG. 7. A 60 Hz, corona-free, supply voltage 20 having an associated impedance 477 energizes respective model generator stator bars 489. Respective stator bars 489 are placed in simulated stator slots 487 and 485 and held firmly. Slots 487 and 485 are made of either aluminum or steel plates cut to fit the slot section of stator bars 489. A 1.3 nano-farad ceramic coupling capacitor 491 is used as a coupling impedance which allows PD current 483 to pass through current transformer 481 coupled thereto. The bandwidth of data collection is 100,000 to 800,000 Hertz. Data is collected for thirty seconds for each PD pattern. Multiple, sequential patterns are collected for each respective stator bar 489.

The results of the quality assessment approach for various histogram type similarity measures is next presented as an example of the operation of the quality assessment approach. This example includes comparison of the 2D Chi-square, correlation, and Kolmogorov-Simimov methods of statistically analyzing PD data. The number of test samples and type of reference quality classes used for each quality class is tabulated in Table 1. For quality class matching, both the linear and the logarithmic-scaled PD data were used.

TABLE 1

Number of Testing Samples for each Quality Class

| Quality class | Number of Measurements |
|---|---|
| Good Bar | 10 |
| Suppresser | 5 |
| Metal Wires | 5 |
| No Int Grade | 10 |
| Cu Delam | 5 |
| Whitebar | 5 |
| Therm & VE | 4 |
| Arm Control | 4 |
| Slot Dischg | 4 |

In this example, there are a total nine quality classes, eight for defects and one for "healthy" insulation. Fifty-two patterns were collected. The respective reference data sets 324 and respective quality class thresholds 418 are determined for each quality class and similarity measure. Quality class thresholds 418 of the correlation method for each quality class are tabulated in Table 2 for both a linear and a logarithmic treatment of the patterns. The linear thresholds are calculated when data from the PD magnitude 34 (FIG. 1) is a linear scale. The logarithmic threshold are calculated based on a logarithmic PD magnitude 34.

TABLE 2

Correlation Thresholds for each Quality class

| Quality class | Linear Thresholds | Logarithm icThresholds |
|---|---|---|
| Good Bar | 0.93 | 0.97 |
| Suppresser | 0.79 | 0.96 |
| Metal Wires | 0.95 | 0.97 |
| No Int Grade | 0.87 | 0.96 |
| Cu Delam | 0.98 | 0.98 |
| Whitebar | 0.98 | 0.98 |
| Therm & VE | 0.58 | 0.98 |
| Arm Control | 0.88 | 0.98 |
| Slot Dischg | 0.97 | 0.95 |

The "quality class detection" and "quality class identification" power of each histogram similarity measure was determined. Defect detection power is defined as the "probability of detecting" the presence of a defect. "Identification power" is the probability of identifying the quality class correctly. A "false positive" is a quality class identification when no quality class should have been identified. These results are summarized in Table 3.

TABLE 3

Performance of the Testing Stage Using 1D Phase Histograms

| Test Type | Defect Detection | False Positive | Defect ID |
|---|---|---|---|
| Chi-squares | 100% | 70% | 78% |
| Correlation | 100% | 0% | 96% |
| Kolmogorov-Simirnov 1 | 100% | 0% | 96% |
| Kolmogorov-Simirnov 2 | 100% | 0% | 98% |

A preferred embodiment of conducting the histogram similarity analysis is to use the 1D phase Kolmogorov-Simimov 2 approach because the it provides the best measure in quality class detection and quality class identification as is illustrated in Table 3. Out of fifty-five pattern sets acquired from the defective bars all of them were correctly identified as defective yielding a 100% defect detection confidence level as is illustrated in Table 4. On the other hand, fifty-five of the fifty-six patterns are correctly identified yielding 98% class identification confidence.

The detailed experimental results for the 1D phase Kolmogorov-Simirnov 2 test are summarized in the confidence matrix illustrated in Table 4. The number in the "ith" row and "jth" column of this table shows how many samples from quality class "i" is classified to quality class "j". For example the row titled "No Int grade" or No internal grading shows that only one sample is miss-classified as quality class "Cu Delam" or Copper delamination degradation while nine samples are correctly classified as the quality class "No Int grade."

TABLE 4

Confidence Matrix for the Kol-Simiornov 2 Test Using 1D Phase Histogram

| | Supr-essor | Metal wire | No Int grade | Cu Delam | White bar | Therm& VE | Slot dischg | Am control | Good bars |
|---|---|---|---|---|---|---|---|---|---|
| Supressor | 5 | | | | | | | | |
| Metal wire | | 5 | | | | | | | |
| No Int grad | | | 9 | 1 | | | | | |
| Cu Delam | | | | 5 | | | | | |
| Whitebar | | | | | 5 | | | | |
| Therm&VE | | | | | | 4 | | | |
| Slot dischg | | | | | | | 4 | | |
| Arm control | | | | | | | | 4 | |
| Good bars | | | | | | | | | 10 |

The 1D phase Kolmogorov-Simimov 1 method provides similar results as the 1D phase Kolmogorov-Simimov 1 method (Table 5). It also has 100% quality class detection as indicated in Table 3. The quality class identification, however, is slightly less at 96%. One test method may be more adept at identifying quality classes than another method. In tables 4 and 5 the 1D phase Kolmogorov-Simimov 2 erred in identifying one no grade and the 1D phase Kolmogorov-Simirnov 1 erred in identifying one bared copper/insulation delamination test. These errors are further eliminated by employing multiple statistical distance comparisons using different statistical methods. For example, both the 1D phase Kolmogorov-Simirnov 1 and the 1D phase Kolmogorov-Simirnov 2 can be combined to improve fault identification.

TABLE 5

Confidence Matrix for the Koi-Simiornov 1 Test Using 1D Phase Histogram

|  | Supr-essor | Metal wire | No Int grade | Cu Delam | White bar | Therm& VE | Slot dischg | Am control | Good bars |
|---|---|---|---|---|---|---|---|---|---|
| Supressor | 5 | | | | | | | | |
| Metalwire | | 5 | | | | | | | |
| No Int grade | | | 10 | | | | | | |
| Cu Delam | | | | 5 | | | | | |
| Whitebar | | 1 | | | 4 | | | | |
| Therm&VE | | | | | | 4 | | | |
| Slot dischg | 1 | | | | | | 3 | | |
| Arm control | | | | | | | | 4 | |
| Good bars | | | | | | | | | 10 |

3. Condition Monitoring

The objective of a condition monitoring method is to quantify the health of the system to predict catastrophic failures, to avoid excessive damage and unexpected down times, and to allow condition-based maintenance. The condition monitoring method acquires PD measurements periodically and compares them with past PD measurement to detect statistical deviations. Any significant deviation in the most current measurement is identified as an indication of change in the PD activity of the high voltage insulation.

The condition in which the measurements remain statistically unchanged is hereinafter identified in this Specification as a "steady state condition." In a typical generator with a healthy insulation system, a steady state condition lasts about 3 to 6 months. While the measurements in each state remain unchanged, they follow a time dependent trend line over several steady states. The underlying truism in condition monitoring and failure detection system is that the measurements during a pre-catastrophic state do not match to the predicted values obtained from the trend analysis of the earlier states, because catastrophic deterioration is expected to be revealed by the rate of increase in the PD activity. The implementation of the condition monitoring method involves the following steps: 1) preprocessing as discussed above; 2) feature extraction as discussed above; 3) establishing a parametric trend model; 4) estimating the trend parameters; 5) and, predicting the PD trend so as to detect pre-catastrophic failures.

By way of example, and not limitation the "steady state condition" of a high voltage machine is about six months and the data are collected every week on full load operation. Due to external operating conditions and the physical nature of the PD activity, there are variations and noise in day to day PD measurements. To suppress noise, the seven day PD measurement is averaged on a weekly basis. PD measurements are taken at the full load condition of the high voltage electrical equipment. To quantify the daily fluctuations, the distance between the weekly average and the daily measurements is measured. Next, a monthly average is calculated based on four weekly averages. Then weekly fluctuations are calculated based on the monthly average. These fluctuations provide information about the short term behavior of the PD activity. The average value of these fluctuations is expected to be a constant as long as the equipment is not in a pre-catastrophic state. Next, measure the similarity of the weekly and monthly averages to a predetermined previous step.

PD measurements for condition monitoring typically are taken at preselected intervals that depend on the expected rate of insulation deterioration, as such, the weekly and monthly intervals may be any other interval of time.

Statistical analysis used to determine the predicted catastrophic failure is based on condition monitoring is as follows.

Let $P_i^m$ and $P_i^w$ represents the monthly and weekly average PD measurements. Let $D^m(\tau)$ and $D^w(\tau)$ be the distance between $\tau$ apart measurements, i.e., $$D^m(\tau)=d(P_i^m, P_{i+\tau}^m) \tag{24}$$

and $$D^w(\tau)=d(P_i^w, P_{i+\tau}^w) \tag{25}$$

where the distance d is one of the histogram similarity measures introduced previously. Typically, the distance between the measurements increases as the time lag $\tau$ increases. Therefore, the distance values conform to trend line models of the form:

$$D^m(\tau)=A^m\tau+B^m+\sqrt{\rho^m}N^m(\tau), \tau=1, 2, 3, \ldots T \tag{26}$$

and $$D^w(\tau)=A^w\tau+B^w+\sqrt{\rho^w}N^w(\tau), \tau=1, 2, 3, \ldots T \tag{27}$$

where $N^m(\tau), N^w(\tau), \tau=1, 2, 3, \ldots T$ are Gaussian zero mean unit variance white noise processes and $\rho^m$ and $\rho^w$ are the variance of $D^m(\tau)$ and $D^w(\tau)$ respectively. "T" is a number representing a predetermined number of PD measurements before the latest PD measurement. For example, "T" may be five steps from the latest measured step. While equations (26) and (27) are expressed as linear models, other models may be utilized such as a hyperbolic model or log linear model of the form presented in equations (28) and (29) respectively.

$$D^m(\tau)=\tau^{\alpha^m}+\beta^m+\sqrt{\delta^m}N^m(\tau), \tau=1, 2, 3, \ldots T \tag{28}$$

and $$D^w(\tau)=\tau^{\alpha^w}+\beta^w+\sqrt{\delta^w}N^w(\tau), \tau=1, 2, 3, \ldots T \tag{28}$$

Note that both the parameter A and the parameter $\alpha$ control the rate at which the partial discharge activity changes. While A quantifies a first order polynomial change, $\alpha$ quantifies a change faster than any polynomial but less than an exponential change. The parameter which controls the rate of increase as identified by parameter A and parameter α is identified as the "trend rate." The parameter B and the parameter β determine the constant difference between consecutive PD measurements. The parameter B and the parameter β is identified as the "trend constant." The variance of the process as is identified as the "trend variance." The condition during which the trend rate is constant shall be identified as the "steady state condition." The "trend rate" and the "trend variance" of the weekly and monthly averages are expected to increase indicating normal increased PD activity. However, the increase in these parameters is expected to be linear when the insulation system is still relatively healthy. Note that if the time difference τ and the distance $D^w(\tau)$ are statistically independent, the trend rate estimate will be about zero.

The discussion that follows is based on the linear monthly model, however, any of the trend line models identified above may be substituted for the linear monthly model.

3(a) Estimation of the Trend Parameters

The parameters of the model typically is estimated using the linear or log linear least squares method. For example, the linear monthly model provides estimate parameters based on the following formulas:

$$\hat{A}^m = \frac{\sum_{\tau=1}^{T} D^m(\tau)\tau - \frac{1}{T}\sum_{\tau=1}^{T} D^m(\tau)\sum_{\tau=1}^{T} \tau}{\sum_{\tau=1}^{T} \tau^2 - \frac{1}{T}\left(\sum_{\tau=1}^{T} \tau\right)^2} \quad (30)$$

$$\hat{B}^m = \frac{1}{T}\sum_{\tau=1}^{T} D^m(\tau) - \hat{A}^m \frac{1}{T}\sum_{\tau=1}^{T} \tau \quad (31)$$

$$\bar{\rho}^m = \frac{\sum_{\tau=1}^{T}\left(D^m(\tau) - \hat{A}^m \tau - \hat{B}^m\right)}{T - 2} \quad (32)$$

3(b) Predicted Partial Discharge Activity

In order to detect an outstanding state, the "trend rate" must be estimated based on past PD measurements and compared with the PD measurement estimated from the new measurements. If the variance of the process is known, the "trend rate" estimate is Gaussian with distribution $$N\left(\hat{A}^m, \rho^m \bigg/ \left(\sum_{\tau=1}^{T} \tau^2 - \left(\frac{1}{T}\sum_{\tau=1}^{T} \tau\right)^2\right)\right) \quad (33)$$

Since the variance of the process is undetermined, the estimate $\hat{A}^m$ is t-distributed with T−2 degrees of freedom. Therefore the (100−2P)% catastrophic confidence interval is given by $$|\hat{A}^m - A^m| < t_c \frac{\sqrt{\hat{\rho}^m}}{\left(\sum_{\tau=1}^{T} \tau^2 - \left(\frac{1}{T}\sum_{t=1}^{T} \tau\right)^2\right)} \quad (34)$$

where $t_c$ is such that for the t-distribution with T−2 degrees of freedom, there is P% chance that $t > t_c$. Similarly, for known process variance the "trend constant" estimate is Gaussian with distribution $$N\left(B^m, \rho^m \sum_{\tau=1}^{T} \tau^2 \bigg/ T\left(\sum_{\tau=1}^{T} \tau^2 - \left(\frac{1}{T}\sum_{\tau=1}^{T} \tau\right)^2\right)\right). \quad (35)$$

For undetermined $p^m$, the trend constant estimate is t-distributed with T−2 degrees of freedom. Therefore a (100−2P)% catastrophic confidence interval is given by $$|\hat{B}^m - B^m| < t_c \sqrt{\hat{\rho}^m \sum_{\tau=1}^{T} \tau^2 \bigg/ T\left(\sum_{\tau=1}^{T} \tau^2 - \left(\frac{1}{T}\sum_{\tau=1}^{T} \tau\right)^2\right)} \quad (36)$$

where P is a predetermined number to provide a desired confidence level. For example, a "P" value of 0.5 provides a confidence level of 99%. The predicted value of the distance, $D^m(\tau_0) = d(P_i^m, P_{i-\tau_0}^m)$, of a future partial discharge measurement $p_i^m$ and the partial discharge measurement $\tau_0$ steps behind it may be obtained from the trend line mode defined in equation (37):

$$\hat{D}^m(\tau_0) = \hat{A}^m \tau_0 + \hat{B}^m. \quad (37)$$

If the variance of the process is known, the predicted value $\hat{D}^m(\tau_0)$ has a Gaussian distribution based on the formula in equation (38):

$$N\left(A^m \tau_0 + B^m, \rho^m \left\{\frac{1}{T} + \left(\tau_0 - \frac{1}{T}\sum_{\tau=1}^{T} \tau\right)^2 \bigg/ \left(\sum_{\tau=1}^{T} \tau^2 - \left(\frac{1}{T}\sum_{\tau=1}^{T} \tau\right)^2\right)\right\}\right). \quad (38)$$

The predicted distance $\hat{D}^m(\tau_0)$ is t-distributed with T−2 degrees of freedom. Therefore the (100−2P)% confidence interval is given by $$\left|\hat{D}^m(\tau_0) - D^m(\tau_0)\right| < t_c \sqrt{\hat{\rho}^m \left\{\frac{1}{T} + \left(\tau_0 - \frac{1}{T}\sum_{\tau=1}^{T} \tau\right)^2 \bigg/ \left(\sum_{\tau=1}^{T} \tau^2 - \left(\frac{1}{T}\sum_{t=1}^{T} \tau\right)^2\right)\right\}} \quad (39)$$

Steps of the condition monitoring method are summarized as follows:

Step 1. Collect "Z" number of PD measurements and compute the distance of the most recent measurements to the τ step back partial discharge measurements, for each $\tau \leq T$ where T is a value less than the number of measurements "Z."

Step 2. Forming a parametric trend relationship between the distances $D^m(\tau)$ and $D^w(\tau)$ and the time lag τ as illustrated in equations (26) through (29).

Step 3. Estimate the trend parameters as described in equations (33)–(36).

Step 4. Predict the next step of the future partial discharge activity as described in equation (37).

Step 5. Collect the next partial discharge measurement and compute the one step difference as described in equation (24) or (25).

Step 6. Compare the difference between the actual one step distance and the predicted distance with the value described in equation (39). If the actual one step distance is within allowable limits, update the trend parameter estimation using the new measurement. Otherwise tag the measurements as a potential indication of the change in the condition of the insulation system. Repeat the prediction-comparison procedure for a number of times to assure an indication of change in the condition of the insulation system.

Step 7. Estimate new trend parameters for the new condition.

Step 8. Compare the new "trend rate" and constant with the previous "trend rate" and constant using the equations (34) and (36). If both are beyond the values described in equations (34) and (36), generate an indication denoting a potential pre-catastrophic condition of the measured insulation. Repeat the observations to verify the pre-catastrophic condition.

The condition monitoring process as defined in this section provides a method of monitoring high voltage electrical equipment to predict immanent catastrophic insulation failures. This invention thus obviates the need for condition-based monitoring of electrical insulation within high voltage equipment in service.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A statistical method of condition monitoring the insulation in high voltage equipment utilizing partial discharge measurements, comprising the following steps:

calculating at least one analysis feature of undetermined insulation based on a plurality of partial discharge measurements;

estimating trend parameters of said at least one analysis feature based on a linear trend line generated based on a plurality of previously determined ones of said analysis feature;

predicting an estimated analysis feature statistical distance of said analysis feature with respect to said trend line;

comparing said predicted analysis feature statistical distance with an actual analysis feature statistical distance so as to determine whether the condition of said undetermined insulation has changed.

2. The statistical method of condition monitoring as recited in claim 1 further comprising the steps of:

conditioning said partial discharge measurements for computer manipulation;

generating a plurality of partial discharge measurements from said high voltage equipment with undetermined insulation so as to calculate at least one said analysis feature of said undetermined insulation.

3. The statistical method of condition monitoring as recited in claim 2 further comprising the steps of estimating said trend parameters of said analysis features based on a parabolic trend line generated in correspondence with previously determined ones of said analysis features.

4. The statistical method of condition monitoring as recited in claim 1 further comprising the steps of estimating said trend parameters of said analysis features based on a parabolic trend line generated in correspondence with previously determined ones of said analysis features.

5. The statistical method of condition monitoring as recited in claim 1 further comprising the steps of estimating said trend parameters of said analysis features based on a log linear-trend line generated in correspondence with previously determined ones of said analysis features.

6. The statistical method of condition monitoring as recited in claim 1 further comprising the step of generating a change in condition signal when the measured statistical distance is outside a normal operating limit.

7. The statistical method of condition monitoring as recited in claim 1 further comprising the steps of:

synchronizing the phase of said partial discharge measurements over a single cycle of a supply voltage;

normalizing the partial discharge magnitude of said partial discharge measurements; and removing excitation noise from said partial discharge measurements.

8. The statistical method of condition monitoring as recited in claim 7 further comprising the step of taking the logarithm of said partial discharge magnitudes to minimize the low magnitude high partial discharge event count.

9. The statistical method of condition monitoring as recited in claim 8 further comprising the steps of comparing the latest calculated said trend parameters with the previously calculated ones of said trend parameters.

10. The statistical method of condition monitoring as recited in claim 9 further comprising the step of generating a pre-catastrophic insulation signal when the difference in a plurality of previous ones of said trend parameters and current said trend parameters are greater than a catastrophic confidence interval value.

* * * * *